(12) United States Patent
Landru et al.

(10) Patent No.: US 12,002,690 B2
(45) Date of Patent: Jun. 4, 2024

(54) SYSTEM FOR FRACTURING A PLURALITY OF WAFER ASSEMBLIES

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR)

(73) Assignee: SOITEC, Bernin (FR)

( * ) Notice: Subject to any disclaimer, the term of this patent is extended or adjusted under 35 U.S.C. 154(b) by 364 days.

(21) Appl. No.: 17/435,899

(22) PCT Filed: Feb. 26, 2020

(86) PCT No.: PCT/FR2020/050370
§ 371 (c)(1),
(2) Date: Sep. 2, 2021

(87) PCT Pub. No.: WO2020/188170
PCT Pub. Date: Sep. 24, 2020

(65) Prior Publication Data
US 2022/0181173 A1 Jun. 9, 2022

(30) Foreign Application Priority Data
Mar. 15, 2019 (FR) ...................................... 1902680

(51) Int. Cl.
*H01L 21/67* (2006.01)
*H01L 21/762* (2006.01)

(52) U.S. Cl.
CPC .. *H01L 21/67092* (2013.01); *H01L 21/67023* (2013.01); *H01L 21/76254* (2013.01)

(58) Field of Classification Search
CPC ......... H01L 21/67092; H01L 21/67023; H01L 21/76254
See application file for complete search history.

(56) References Cited

U.S. PATENT DOCUMENTS

| 9,257,319 B2* | 2/2016 | Keigler ............. H01L 21/67057 |
| 2002/0088558 A1 | 7/2002 | Ohmi et al. |
| 2009/0038758 A1* | 2/2009 | Legros ............. H01L 21/76254 156/763 |

FOREIGN PATENT DOCUMENTS

| EP | 0867917 A2 | 9/1998 |
| EP | 0867918 B | 9/1998 |

(Continued)

OTHER PUBLICATIONS

Taiwanese Office Action and Search Report for Application No. 11220743290 dated Jul. 31, 2023, 15 pages.

(Continued)

*Primary Examiner* — Marc Anthony Armand
(74) *Attorney, Agent, or Firm* — TraskBritt (57) ABSTRACT

A system for fracturing a plurality of wafer assemblies, one of the wafers of each assembly comprising a plane of weakness and each assembly comprising a peripheral lateral groove comprises: a cradle for keeping the assemblies of the plurality of assemblies spaced apart and parallel to one another, along a storage axis; a separation device for applying separating forces in the peripheral groove of an assembly arranged in a fracture zone of the separating device, the separating force aiming to separate the wafers of the assembly from one another so as to initiate its fracture at the plane of weakness; and a drive device configured to move along the storage axis of the cradle opposite the separating device so as to successively place an assembly of the cradle in the fracture zone of the separation device.

20 Claims, 4 Drawing Sheets

(56) References Cited

FOREIGN PATENT DOCUMENTS

| | | |
|---|---|---|
| FR | 2995440 A1 | 3/2014 |
| FR | 2919960 B1 | 9/2021 |
| JP | H11-045840 A | 2/1999 |
| JP | 2004-214399 A | 7/2004 |
| JP | 2005-079388 A | 3/2005 |
| WO | 2003/013815 A1 | 2/2003 |
| WO | 2005/043615 A1 | 3/2005 |

OTHER PUBLICATIONS

International Search Report for International Application No. PCT/FR2020/050370 dated May 19, 2020, 4 pages.
International Written Opinion for International Application No. PCT/FR2020/050370 dated May 19, 2020, 7 pages.
Singapore Written Opinion for Singapore Application No. 11202109549W dated Jun. 9, 2023, 8 pages.
Japanese Notice for Refusal for Japan for Application No. 2021-555243 dated Feb. 9, 2024, 8 pages.

\* cited by examiner

SYSTEM FOR FRACTURING A PLURALITY OF WAFER ASSEMBLIES

CROSS-REFERENCE TO RELATED APPLICATIONS

This application is a national phase entry under 35 U.S.C. § 371 of International Patent Application PCT/FR2020/050370, filed Feb. 26, 2020, designating the United States of America and published as International Patent Publication WO 2020/188170 A1 on Sep. 24, 2020, which claims the benefit under Article 8 of the Patent Cooperation Treaty to French Patent Application Serial No. 1902680, filed Mar. 15, 2019.

TECHNICAL FIELD

The present disclosure relates to a system for fracturing, on an embrittlement plane, two wafers of materials that are assembled together. This system is configured to collectively, but not necessarily simultaneously, process a plurality of such assemblies. The system particularly can be implemented in a fracturing step of a method consistent with SMART CUT® layer transfer technology.

BACKGROUND

Document WO 2005/043615 states that the main steps of such a method comprise a step of forming an embrittlement plane in a wafer of materials, called a "donor wafer," for example, through implantation of light species of helium and/or hydrogen. This wafer is subsequently assembled with a second wafer, called "support wafer," and embrittlement heat treatment is applied to this assembly in order to induce the donor wafer to fracture on the embrittlement plane. In this way, a thin layer, which is defined between the assembly surface of the donor wafer and the embrittlement plane, is transferred onto the support wafer. In particular, the fracture can be implemented by a variety of fracture devices, the descriptions of which can be found in documents FR 2919960, FR 2995440 or EP 867917.

The aforementioned document WO 2005/043615 also states that the fracture can be obtained spontaneously during the embrittlement heat treatment, when the assembly is provided with a sufficient thermal budget. However, spontaneous detachment during heat treatment is sometimes unsuitable for some situations that the document of the prior art lists in detail.

In order to overcome this problem, document WO 2005/043615 proposes another fracture mode, in which the embrittlement heat treatment is applied to the assembly in order to sufficiently embrittle the embrittlement plane, yet without spontaneously initiating the fracture. Then, in a step following the heat treatment, an energy pulse is applied to the assembly in order to induce the initiation and the propagation of a self-sustained fracture wave, which leads to the thin layer being detached from the donor wafer and transferred onto the support wafer. This fracture mode can be particularly advantageous, in particular, since the surface finish of the added layer generally exhibits enhanced roughness compared to the surface finish of a layer transferred by spontaneous detachment during heat treatment.

In order to implement this advantageous method, document WO 2005/043615 envisages collectively and simultaneously treating the assemblies of wafers in order to thermally embrittle them and apply the energy pulse thereto. It is thus envisaged for the detachment device disclosed in document WO 2003/013815 to be used for simultaneously applying the energy pulse to an entire batch of assemblies. To this end, the detachment device manipulates the plurality of assemblies forming the batch, disposed in a cradle, using a pusher in order to place them in the detachment position. In this respect, it is to be noted that the assemblies are not firmly held in the cradle from which they are taken, and that they are liable to move slightly, which makes them difficult to handle. It subsequently closes jaws over the assemblies, which jaws, through a wedge action applied on the embrittlement planes of the assemblies, tend to separate them into two parts, inducing the initiation and the propagation of fracture waves. The first parts comprise the support wafers, on which the thin layers have been added and the second parts comprise the remainders of the donor wafers. The detachment device subsequently collectively handles the first and second parts in order to store them in separate cradles in order to be able to apply additional treatments thereto.

During the step of detaching the two parts, the jaws are respectively engaged in side and peripheral grooves of the assemblies, defined by peripheral chamfers on the assembled faces of the donor wafer and of the support wafer. This groove is very small, approximately 200 to 300 microns deep and wide for 300 mm circular wafers. Closing the jaws over all the assemblies and at the same time very precisely engaging wedges in the peripheral grooves of the assemblies requires pinpoint accuracy, which makes the device complex, expensive and unreliable in this application. Furthermore, if an assembly is not correctly fractured, and the two parts of an assembly, therefore, cannot be separated from each other following the closure of the jaws, the first and second parts of the batch that has just been treated cannot be handled collectively, and the operation of the device must be interrupted. More generally, the detachment device disclosed in the aforementioned document is complex, since it aims to simultaneously perform operations for fracturing and operations for handling the assemblies and the separated parts using one item of equipment.

BRIEF SUMMARY

An aim of the present disclosure is to at least partly overcome the aforementioned disadvantages. More specifically, the aim of the disclosure is to provide a system for fracturing assemblies that is simple and reliable and that does not require the individual or collective handling of the assemblies in order to perform the fracture operation.

The subject matter of the disclosure comprises a simple and reliable system for fracturing a plurality of wafer assemblies, one of the wafers of each assembly comprising an embrittlement plane and each assembly comprising a peripheral side groove, the device comprising:
  a cradle for keeping the assemblies of the plurality of assemblies spaced apart from and parallel to each other, along a storage axis;
  a separation device for applying separation forces in the peripheral groove of an assembly disposed in a fracture zone of the separation device, the separation forces being intended to separate the wafers of the assembly from each other so as to initiate the fracturing thereof on the embrittlement plane;
  a drive device configured to move along the axis for storing the cradle opposite the separation device so as to successively place an assembly of the cradle in the fracture zone of the separation device.

Such a fracturing system allows a plurality of assemblies to be collectively fractured, without simultaneously inducing this fracture on all the assemblies and without individually handling each assembly. The assemblies are fractured while they are disposed in the cradle. These principles allow the fracturing system to be significantly simplified and made more reliable.

According to other advantageous and non-limiting features of the disclosure, considered alone or according to any technically feasible combination:
- the distance separating two assemblies in the cradle is constant;
- the fracture zone is configured to accommodate a single assembly and the separation device processes one assembly at a time;
- the drive device allows the cradle to be moved opposite the separation device at a constant speed;
- the drive device allows the cradle to be moved opposite the separation device step-by-step;
- the drive device is a cradle support of a furnace;
- the cradle rests on the cradle support;
- the separation device is fixed;
- the separation device is produced by a compressor allowing a high-pressure fluid jet to be generated;
- the separation system comprises a nozzle for shaping the fluid jet;
- the separation system comprises a tool disposed at the end of a movable arm;
- the cradle is provided with a separation part;
- the separation part has a plurality of blades engaged in the peripheral side grooves of the assemblies, when these are housed in the cradle;
- the separation device is a presser device for applying a force on an assembly guided toward the separation part;
- the separation device comprises an endless screw having a helical thread, with a blade being disposed in the thread to the right of the fracture zone.

According to another aspect, the disclosure relates to a method for fracturing a plurality of assemblies of wafers disposed in a cradle, wherein the assemblies are kept spaced apart from and parallel to each other, one of the wafers of each assembly comprising an embrittlement plane and each assembly comprising a peripheral side groove, the method comprising the following steps:
- moving the cradle along the storage axis so that it is opposite a separation device so as to successively place an assembly of the cradle in a fracture zone of the separation device;
- applying, by means of the separation device, separation forces in the peripheral groove of the assembly disposed in the fracture zone, the separation forces being intended to separate the wafers of the assembly from each other so as to initiate the fracturing thereof on the embrittlement plane.

BRIEF DESCRIPTION OF THE DRAWINGS

Further features and advantages of the disclosure will become apparent from the following detailed description, with reference to the accompanying drawings, in which.

DETAILED DESCRIPTION

Figure 1:
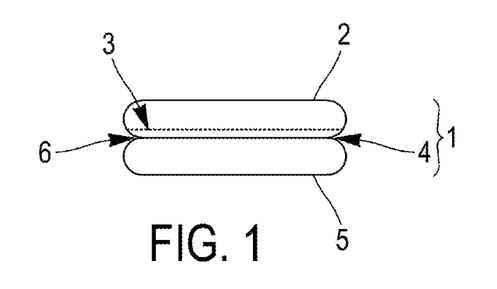
FIG. 1 depicts a cross-sectional view of a particular example of a fracturable assembly.

As stated in the introduction of this application, a fracturing system according to the present description is particularly intended to be implemented during a fracturing step of a layer transfer method, for example, consistent with SMART CUT® technology. Before implementing this system, and in accordance with the preliminary steps of this technology, assemblies were therefore prepared that were each made up of a donor wafer and a support wafer adjoining each other. Each wafer of material is defined by two facing main faces and a peripheral side edge. The two wafers are respectively adjoined on one of their main faces in order to form an assembly. It is also common for the wafers of material to assume a circular shape, but the disclosure is by no means limited to such a shape. FIG. 1 depicts a cross-sectional view of a particular example of such an assembly 1. This assembly is formed by a donor wafer 2, in which an embrittlement plane 3 has been formed, for example, through implantation of light species of hydrogen and/or helium through a main face of this wafer 2. The embrittlement plane 3 defines, with a main face of the donor wafer 2, a thin layer 4, which is intended to be transferred onto a support wafer 5. The extensive literature describing SMART CUT® technology can be referred to for further details of the steps, and the variants thereof, which can be implemented to produce such an assembly 1.

In order to avoid sharp edges, which are liable to break and be the source of particles and faults, the wafers of materials used to form an assembly 1 are generally provided with an annular chamfer (or peripheral chamfer if these wafers are not circular). This chamfer can extend, on each main face of a wafer, over a few millimeters on the periphery of this face.

Figure 2:
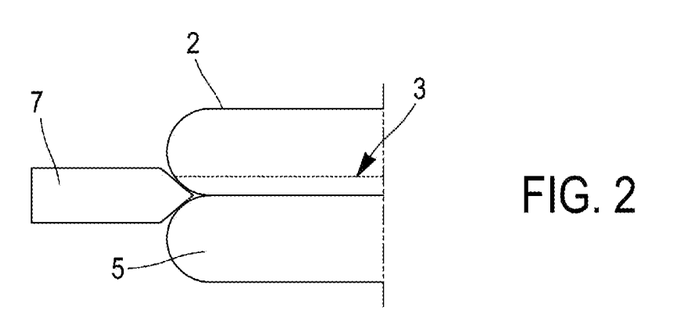
FIG. 2 depicts the application of separation forces on a fracturable assembly.

When two wafers are assembled together to form an assembly such as that depicted in FIG. 1, the chamfers of each wafer combine in order to form a peripheral side groove 6 on the side edge of the assembly 1. The application of a tool, such as a blade 7, in the peripheral side groove 6 causes contact points to be established on the edges of the two facing wafers 2, 5, and a force, called "separation force," to be applied on each of these wafers that is intended to separate them from each other, as depicted in FIG. 2. The term "blade" in the present description denotes any body assuming the shape of a blade, i.e., the end of which is tapered enough to engage in the peripheral side groove 6, in order to be able to apply separation forces to the wafers. By way of an example, the thickness of the end of the blade can be 200 microns or less, and the two faces of the blade together form an angle of approximately 20°.

The separation forces can provide sufficient energy to induce the initiation of a fracture wave on the embrittlement plane 3 and to allow the self-sustained propagation thereof.

In order to allow or to facilitate this fracture mode, the layer transfer method implementing a fracturing system according to the disclosure envisages previously applying embrittlement heat treatment to the assembly 1. The purpose of this treatment is to apply an embrittlement thermal budget that is insufficient for spontaneously inducing the fracture during the heat treatment itself, but that causes a reduction in the binding energy of the embrittlement plane 3. The embrittlement heat treatment also helps to increase the adhesion energy between the two donor 2 and support 5 wafers. The target thermal budget, which can depend on the type of materials forming the wafers and the species forming the embrittlement plane, can be determined merely by experimentation. By way of an example, when the two wafers are made of silicon and the introduced species are made up of hydrogen and optionally of helium with a total dose between 1e16 at/cm$^2$ and 1e17 at/cm$^2$ the embrittlement heat treatment can be within several hundred degrees and 500° C. and applied for a period of several seconds to several hours.

Figure 3:
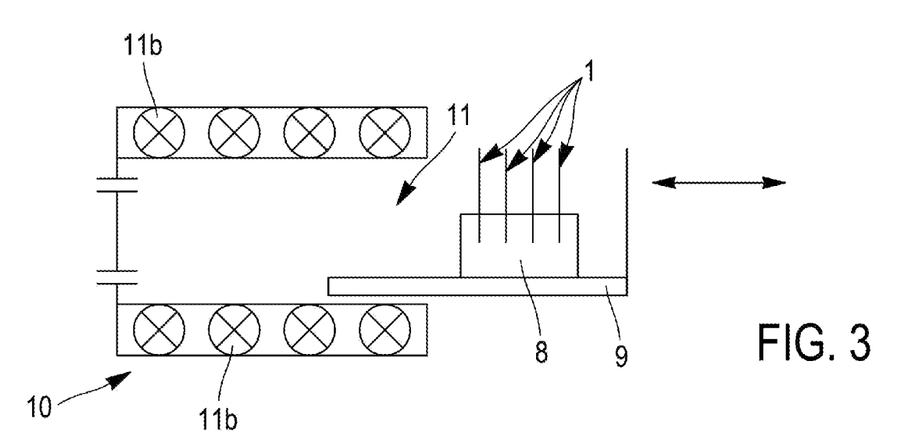
FIG. 3 schematically depicts a horizontal furnace for applying embrittlement heat treatment to a plurality of assemblies.

It is industrially advantageous for the embrittlement treatment to be simultaneously applied to a plurality of assemblies 1. To this end, furnaces are known, called "horizontal furnaces," in which several tens of assemblies 1 can be treated simultaneously. In such a furnace 10, and as is schematically depicted in FIG. 3, several assemblies 1, typically 20 to 50 assemblies, are vertically held in a cradle 8. A plurality of cradles 8 can be disposed, aligned one behind the other, on a cradle support 9. The cradle support can slide between a load/unload position, in which the cradle support 9 is extracted from the furnace, and an annealing position, in which the cradle support 9 is fully inserted into the furnace 10. This furnace is basically made up of a chamber 11, in which the atmosphere can be controlled, and heating elements 11b for determining the temperature of this atmosphere.

Regardless of the manner by which the embrittlement heat treatment was conducted, and on completion of the preliminary steps of preparing assemblies 1, a plurality of assemblies 1 of wafers is available, with one of the wafers 2 of each assembly comprising an embrittlement plane 3. This plane is brittle enough so that, for most of these assemblies at least, the application of a reasonable force on the peripheral side groove 6 causes the initiation and the self-retained propagation of a fracture wave.

In order to implement this fracturing step, the present description provides a fracturing system. This comprises a cradle 8 for holding a plurality of assemblies 1 that are kept spaced apart from and parallel to each other along a storage axis. It is to be noted herein that the assemblies are not forcibly held in the cradle, and that all the degrees of freedom of the assemblies are not blocked, they are therefore liable to move slightly. It can involve a highly conventional cradle, such as that used, for example, to hold wafers in a horizontal furnace, but the disclosure is by no means limited to this type of cradle. More generally, a cradle in this description denotes any device for retaining a plurality of assemblies 1 that are spaced apart from and parallel to each other along a storage axis.

Figure 5:
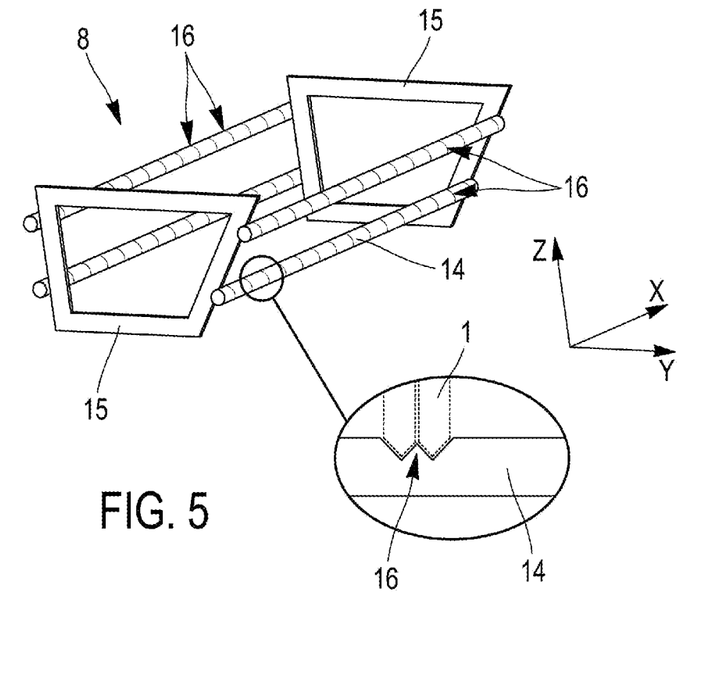
FIG. 5 depicts an example of a cradle for holding a plurality of assemblies.

By way of an example, FIG. 5 depicts a cradle that is compatible with the present description. This cradle 8 in this case is made up of four longitudinal bars 14, which are parallel to each other and the ends of which are respectively secured to a front face 15 also forming elements for supporting the cradle. The longitudinal bars 14 are provided with notches 16 facing each other so as to define housings for accommodating and holding the assemblies 1. The distance between two successive notches of the longitudinal bars therefore defines the distance separating two assemblies and the storage axis X is co-linear to these longitudinal bars. Preferably, in order to facilitate the implementation of the fracturing system, and as will become apparent throughout the remainder of this description, the distance separating two assemblies 1 of the cradle 8 is constant.

Figure 4:
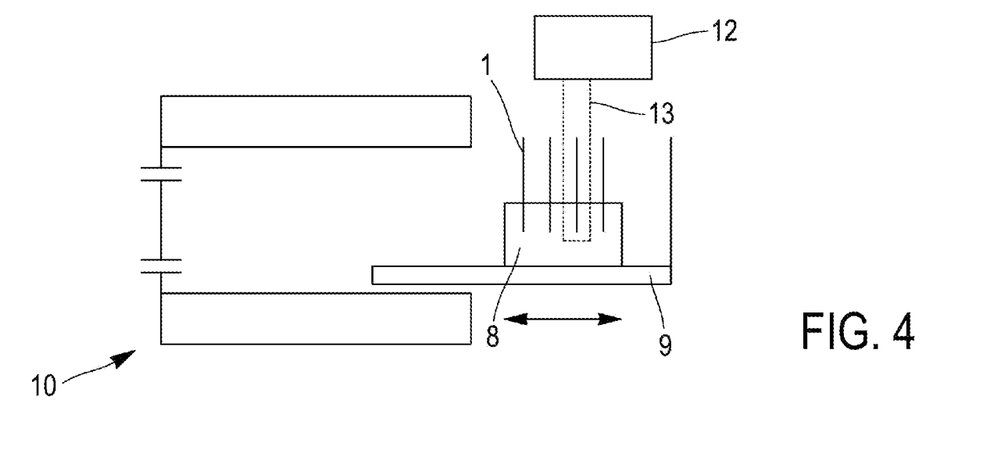
FIG. 4 depicts a preferred embodiment of the fracturing system.

A fracturing system according to the present description also comprises a separation device 12. The purpose of this device is to apply separation forces in the peripheral side groove 6 of an assembly 1 with a view to inducing the fracturing of the donor wafer when this assembly is disposed in a fracture zone 13 for triggering the fracturing of the device (which zone is more simply denoted "fracture zone" throughout the remainder of this description). Various mechanical means will be described hereafter in the remainder of this description that can be implemented by the separation device for applying these separation forces. To begin fracturing an assembly, the cradle 8 is therefore disposed opposite the separation device so as to place an assembly 1 of the cradle 8 in the fracture zone 13 (FIG. 4). Preferably, the fracture zone 13 allows a single assembly to be accommodated and the separation device is configured to apply the separation forces intended to induce the fracture on this single assembly. This feature allows a particularly simple and reliable fracturing system to be formed.

To allow the plurality of assemblies 1 disposed in the cradle 8 to be fractured, it is envisaged for the cradle 8 to be moved opposite the separation device in the storage direction, and thus to successively place an assembly 1 of the cradle 8 in the fracture zone 13.

To this end, the fracturing system comprises a drive device that allows the cradle 8 and/or the separation device to be moved relative to each other. This movement occurs along the storage axis, so that the assemblies disposed in the cradle are successively placed one after the other, during the movement, in the zone for triggering the fracture.

Advantageously, the drive device allows the cradle 8 to be moved opposite the separation device 12 at a constant speed for the entire duration of the treatment implemented by the fracturing system. According to an alternative embodiment, provision alternatively can be made for this movement to be performed step-by-step, in order to place the assemblies 1 in the fracture zone one after the other during steps of successive movements. An assembly can then remain fixed, for a determined period of time, in the fracture zone in order to be treated therein by the separation device. In all cases, an assembly is fractured while it is in the cradle 8 and this thus avoids individual or collective handling of the assemblies, in order to extract them from the cradle 8 and position them in the fracture position. This feature is also advantageous in that when an assembly is fractured, placing elements in contact with the free faces of the assembly, for example, to support it, is avoided. The applicant has indeed observed that these contacts on the free faces of the assembly during the propagation of the fracture wave could result in the deterioration of the surface quality of the thin layer transferred onto the support wafer.

In the preferred embodiment of the fracturing system depicted in FIG. 4, the drive device is made up of or comprises the cradle support 9 of a horizontal embrittlement furnace 10, and the cradle 8 of the fracture device and that used to keep the assemblies 1 vertical in the furnace 10. The cradle 8 is disposed on the cradle support 9. It is to be noted that a plurality of cradles 8 can be placed on the cradle support 9, and in this case they will be disposed one behind the other along their storage axes, in order to be able to successively treat the assemblies 1 that they contain.

In this preferred embodiment, the separation device 12 is fixed. It is positioned close to the loading opening of the chamber of the furnace 10 so that, when the cradle support 9 is moved from the annealing position to the load/unload position, for example, on completion of the embrittlement heat treatment, the assemblies 1 are successively disposed, during this movement, in the fracture zone 13 in order to be treated therein one after the other by the separation device 12.

This preferred embodiment is advantageous for many reasons. Firstly, the same cradle 8 used during the embrittlement heat treatment is used as a cradle for the fracturing system. Therefore, the assemblies 1 do not need to be handled in order to place them in a new cradle between the heat treatment step and the fracturing step, which simplifies the sequencing of these steps and avoids any risk of breakage. Advantage is also taken of the mobility of the cradle support 9 in order to produce the drive device for moving the cradle and successively placing the assemblies 1 in the fracture zone 13. Therefore, additional means do not need to be implemented.

Furthermore, the configuration in which the separation device 12 is fixed allows the distance separating the fracture zone 13 from the exit of the furnace 10 to be fixed. Insofar as the speed of movement of the cradle support 9, along the storage axis of the cradle 8, is constant, the assemblies 1 that are successively located in the fracture zone 13 have all been cooled for the same time period and are therefore all brought to the same temperature at the successive instants during which they are positioned in the fracture zone 13. Since the temperature of an assembly 1 can influence the initiation or the propagation of the fracture wave, this embodiment ensures identical or very similar treatment of the assemblies 1. The thin layers 4 added onto the support wafers 5, therefore, all have similar features to each other. Furthermore, in the accidental case whereby an assembly is not perfectly fractured, it is easy for an operator to extract this assembly from the cradle 8 on completion of the treatment conducted by the fracturing system and for the next steps of the method to be executed with the remaining assemblies 1 of the cradle 8.

However, the disclosure is by no means limited to the preferred embodiment that has just been described with reference to the description of FIG. 4. It is thus possible to decide to associate the drive device with the separation device 12, and therefore to move this device while the cradle 8 remains fixed. This embodiment is of particular interest when the separation device 12 and the drive device are both disposed in the chamber of a furnace in order to mechanically induce the assemblies 1 to fracture in situ, during or at the end of the embrittlement heat treatment.

It is also possible to envisage the assemblies 1 being handled immediately before the step implemented by the fracturing system in order to be disposed in a dedicated cradle. This can be required in the event that the embrittlement heat treatment is not implemented in a horizontal furnace such as that previously described, but in another type of furnace, for example, an RTA or microwave type furnace, in which the treatments are commonly conducted on a wafer-by-wafer basis, without a cradle.

It is also possible to envisage fracturing a plurality of assemblies 1 simultaneously, yet without extracting these assemblies from the cradle 8. It is thus possible to provide a plurality of separation devices and a plurality of fracture zones or, alternatively, a single separation device able to treat a plurality of assemblies disposed in the same fracture zone 13.

In general, it is possible to choose to produce the drive device using any automated movement means, for example, a robotic arm, to which the separation device 12 or the cradle 8 can be secured. In all cases, the drive device moves along the storage axis of the cradle, whether or not it is movable or fixed. Furthermore, the separation device is arranged opposite the cradle, so that the movement imparted by the drive device leads to the assemblies 1 of the cradle being successively disposed in the fracture zone 13.

The various embodiments of the separation device 12 will now be described that can be used in combination with the cradle 8 and the drive device to form a fracture device according to the present description. The preamble states that this device is configured to apply separation forces in the peripheral side groove 6 of an assembly 1 disposed in the fracture zone 13, with these separation forces being intended to separate the wafers of the assembly 1 from each other so as to initiate the fracturing thereof on the embrittlement plane 3. It is to be noted that the separation forces by nature do not need to be pulse forces to allow this fracture to be induced, even though it effectively can be induced by pulse type forces.

First Embodiment of the Separation Device

Figure 6:
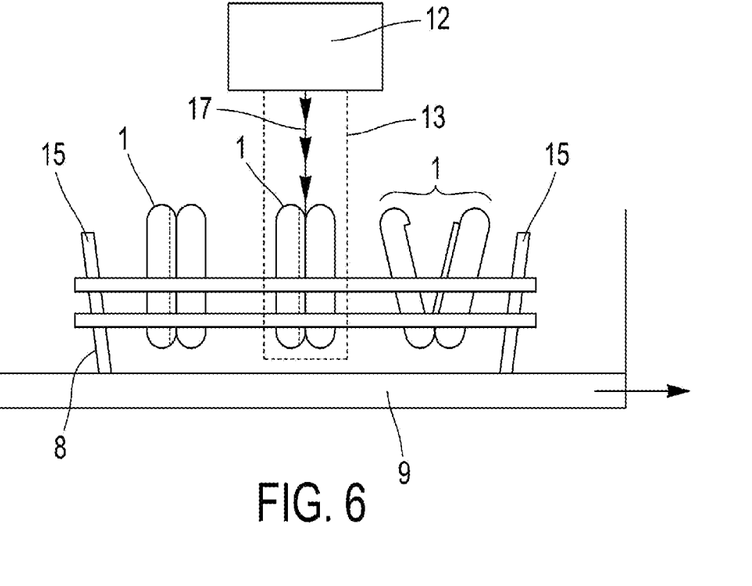
FIG. 6 depicts an embodiment of the separation device.

FIG. 6 depicts a fracturing system, in which the separation device 12 is produced by a compressor allowing a high-pressure fluid jet 17 to be generated, for example, of more than 1000 bar. The compressor is connected to a nozzle for shaping the fluid jet, so that it is of limited size, for example, with a section of approximately 1 mm$^2$ or less, and thus acts like a blade. The fluid is preferably made up of a liquid, such as pure water. In the depicted schematic example, the cradle 8 rests on a cradle support 9, which moves along the axis for storing the assemblies 1 in this cradle, and the cradle 8 supports three assemblies 1. The movement can be that which is intended to place the cradle support 9 in an unload position on completion of the embrittlement heat treatment. The central assembly is precisely disposed in the fracture zone 13 of the separation device 12, this produces a fluid jet 17 that sprays into the peripheral side groove of this assembly. The fluid applies separation forces on each wafer forming the assembly 1, which results in the initiation and propagation of the fracture wave.

The assembly 1 disposed downstream of that which is placed in the fracture zone 13 has been previously treated by the fluid jet 17. It is, therefore, shown fractured in this figure, and the two parts initially forming the assembly 1, on either side of the embrittlement plane, are separated from each other. Some of the notches 16 provided on the longitudinal bars 14 of the cradle 8 can be provided with a V-shaped or W-shaped profile, allowing the two parts to be kept separated after the assembly 1 is fractured, without them coming into contact with the adjacent assemblies.

The assembly 1 disposed upstream of that which is placed in the fracture zone 13 has not yet been fractured. The movement along the storage axis, shown by the arrow X in FIG. 6, will cause this assembly to be placed in the fracture zone 13.

The fluid jet 17 can be continuous so that, as and when the drive device moves, each assembly 1 will successively undergo the forces applied by the fluid jet 17, with the jet engaging at a particular instant of its passage through the fracture zone 13 in the peripheral groove in order to cause it to fracture. Alternatively, the jet can be intermittent, and interrupted during the periods during which no assembly 1 is present in the fracture zone 13. In this case, the sequencing of steps of step-by-step movements of the drive device, in this case the cradle support, can be envisaged in order to successively, fixedly place an assembly 1 in the fracture zone 13, with steps of generating the fluid jet 17. The separation device 12 can be provided with a detector for identifying the presence or the passage of an assembly in the fracture zone 13 and for initiating and interrupting the generation of the fluid jet 17 accordingly. In this intermittent mode, provision can be made to place a plurality of assemblies in a fracture zone 13, which assemblies will be treated by a plurality of fluid jets originating from the compressor. This first embodiment is advantageous in that it overcomes the problem of precise positioning of the separation device opposite the peripheral side groove, with the fluid jet naturally engaging in this groove when the assembly passes under this jet.

Second Embodiment of the Separation Device

In an alternative embodiment of the first embodiment, not shown, the separation device is made up of a tool, such as a blade, disposed at the end of a movable arm. The tool is intended to be inserted into the peripheral side groove 6 of an assembly 1 disposed in the fracture zone 13 and to apply forces intended to initiate the fracturing of the assembly 1. The tool can be inserted into the groove by controlling the movable arm when the assembly is detected as being present in the fracture zone 13. The operation of this alternative embodiment is very similar to that of the first embodiment implementing an intermittent fluid jet and, for the sake of brevity, all the features that can be applied thereto that have already been described with reference to this first embodiment will not be reproduced here.

Third Embodiment of the Separation Device

Figure 7:
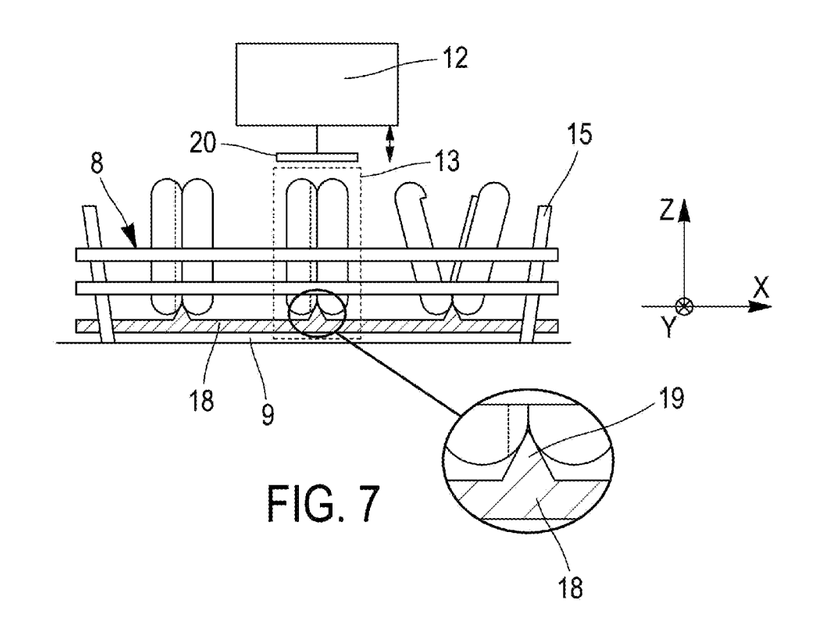
FIG. 7 depicts another embodiment of the separation device.

FIG. 7 depicts another embodiment of a separation device. In this embodiment, the cradle 8 is provided with a separation part 18. This separation part 18 can be held at the ends of the cradle 8 by the front faces 15, as are the longitudinal bars 14. The separation part 18 is provided with blades 19, the ends of which are respectively configured to be able to be housed in the peripheral groove of the assemblies 1 disposed in the cradle 8. The position of the blades 19 along the separation part 18 therefore corresponds to that of the notches 16 that can be provided on the longitudinal bars 14, so that, when the assemblies are placed in their respective housings in the cradle 8, a blade 19 is also engaged in each of the peripheral side grooves. As can be clearly seen in the insert of FIG. 7, the length of the blade is such that its end is in contact with the bottom of the groove, without the peripheral edge of the wafers of the assembly resting on the separation part 18, on either side of the blade 19.

The separation part 18 in this case is disposed on the cradle so as to be located under the assemblies 1 when they are housed in their notches. However, provision can be made for the separation part 18 to be placed at another point of the cradle 8, for example, on one side of this cradle. A plurality of separation parts 18 also can be provided so as to engage a plurality of blades in each peripheral side groove 6.

The separation device 12 comprises, in this third embodiment, a presser device 20 configured to apply a transverse force, i.e., basically within the plane (Y, Z) reproduced in the figure, on the peripheral edge of the assembly 1 disposed in the fracture zone 13. This force is guided, or has a guided component, toward the separation part 18 supporting the blades 19.

During operation, when an assembly 1 is positioned in the fracture zone 13, the presser device 20 is activated in order to come into abutment on the peripheral edge of this assembly. This abutment can be very brief, so as not to hinder the displacement movement of the drive device, for example, of the cradle support 9, when this movement is continuous. The abutment on the edge of the assembly 1 forces the blade 19 of the separation part 18 to engage in the peripheral groove, which leads to the application of the separation forces intended to initiate the fracture wave on the embrittlement plane and to induce its propagation in order to detach the assembly in two parts.

Compared to the second embodiment implementing a tool disposed at the end of a movable arm, this third embodiment is advantageous in that it does not require dynamically placing the tool in the groove of the assembly 1, which can require pinpoint accuracy. The tool, i.e., the blade 19, in this case is pre-positioned in the peripheral groove of each of the assemblies 1 of the cradle 8, and a thrust force simply needs to be applied on each assembly 1 in order to induce the fracture. This thrust force can be perfectly intensity-controlled and it does not need to have high positioning accuracy. It is therefore possible to envisage using this separation device in combination with a continuous or step-by-step movement of the cradle 8, equally. As for the first embodiment, this third embodiment is advantageous in that it overcomes the problem of the precise positioning of the separation device opposite the peripheral side groove, by pre-positioning a blade in each groove of the assemblies.

Fourth Embodiment of the Separation Device

Figure 8:
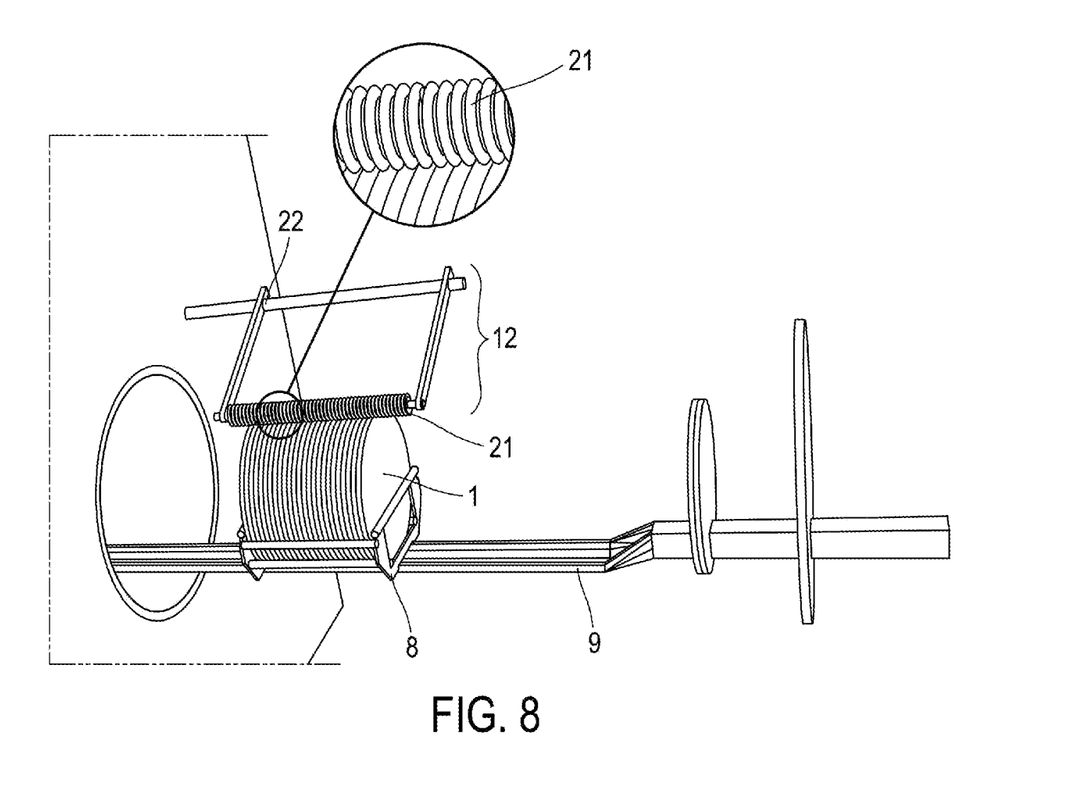
FIG. 8 depicts another embodiment of the separation device.

FIG. 8 depicts a fourth embodiment of a separation device 12. This embodiment shows the drive device, in this case a cradle support 9, a conventional cradle 8, in which a plurality of assemblies 1 is disposed, housed in the notches 16 of the longitudinal bars 14. This embodiment envisages the drive device continuously moving the cradle 8, at a substantially constant speed, even though this does not constitute a necessary condition for its operation.

In this case, the separation device 12 is formed by an endless screw 21, the axis of which extends along the axis for storing assemblies 1 in the cradle 8. The screw 21 has a thread that winds in a helical manner. The pitch of the screw corresponds to the constant distance separating two assemblies 1 consecutively housed in the cradle. The separation between two assemblies 1 of the cradle 8 also could be envisaged as being a multiple of the pitch of the screw.

The endless screw 21 forming the separation device 12 is arranged opposite the cradle 8 so that the edge of the assemblies 1 can engage in the thread of the screw. As depicted in the figure, the endless screw 21 can be retained by a support 22, in which it is free to rotate. The support 22 is detachable, allowing the endless screw 21 to be positioned in a first position, in which the edges of the assemblies are liable to be housed in the thread, or to position the screw in a second, non-active position. The movement of the cradle 8 by means of the separation device 12 causes the endless screw 21 to rotate, while keeping the assemblies 1 engaged in the thread. Each assembly 1, therefore, will be guided by the thread of the screw from one end to the next of this screw 21 as it moves. The endless screw 21 can exert a slight pressure on the edge of the assemblies 1 in order to maintain the cohesion of the assembly during the movement of the drive device.

It also can be envisaged for the endless screw 21 to be rotated by a drive device to which it would be connected, with the rotation of this screw being coordinated with the speed of movement of the drive device. This thus limits the pressure that the assemblies exert on the thread of the endless screw for the rotation thereof.

As is clearly shown in FIG. 8, the screw has a blade at a determined point of its thread, to the right of the fracture zone 13. When an assembly 1 is moved in order to enter the fracture zone 13, the rotation of the endless screw forces the blade to engage in the peripheral groove of this assembly 1. As in the previous embodiment, the forced engagement of the blade in the groove induces the initiation of a fracture wave and its propagation along the embrittlement plane.

Of course, the disclosure is not limited to the embodiments of the fracturing system and to the embodiments of the separation device that have been described and alternative embodiments can be added to the disclosure without departing from the scope of the invention as defined by the claims.

The invention claimed is:

1. A system for fracturing a plurality of wafer assemblies, one wafer of each assembly comprising an embrittlement plane and each assembly comprising a peripheral side groove, the system comprising:
   a cradle configured to keep the assemblies of the plurality of wafer assemblies spaced apart from and parallel to each other along a storage axis;
   a separation device configured to apply separation forces in the peripheral side groove of an assembly disposed in a fracture zone of the separation device, the separation forces being intended to separate wafers of the assembly from each other so as to initiate the fracturing thereof on the embrittlement plane; and
   a drive device configured to move along an axis for storing the cradle opposite the separation device so as to successively place an assembly of the cradle in the fracture zone of the separation device.

2. The system of claim 1, wherein a distance separating two assemblies in the cradle is constant.

3. The system of claim 1, wherein the fracture zone is configured to accommodate a single assembly and the separation device processes one assembly at a time.

4. The system of claim 1, wherein the drive device is configured to provide relative movement between the cradle and the separation device at a constant speed.

5. The system of claim 1, wherein the drive device is configured to provide relative movement between the cradle and the separation device in a step-by-step manner.

6. The system of claim 1, wherein the drive device is a cradle support of a furnace.

7. The system of claim 6, wherein the cradle rests on the cradle support.

8. The system of claim 1, wherein the separation device is fixed.

9. The system of claim 1, wherein the separation device comprises a compressor configured to generate a high-pressure fluid jet.

10. The system of claim 9, wherein the separation device further comprises a nozzle for shaping the fluid jet.

11. The system of claim 1, wherein the separation device comprises a tool disposed at an end of a movable arm.

12. The system of claim 1, wherein the cradle comprises a separation part.

13. The system of claim 12, wherein the separation part has a plurality of blades engaged in the peripheral side grooves of the plurality of wafer assemblies, when the wafer assemblies of the plurality are housed in the cradle.

14. The system of claim 13, wherein the separation device is comprises a presser device configured to apply a force on an assembly guided toward the separation part.

15. The system of claim 1, wherein the separation device comprises an endless screw having a helical thread, with a blade being disposed in the helical thread adjacent the fracture zone.

16. A method for fracturing a plurality of assemblies of wafers disposed in a cradle, wherein the plurality of assemblies of wafers are kept spaced apart from and parallel to each other, one of the wafers of each assembly comprising an embrittlement plane and each assembly comprising a peripheral side groove, the method comprising the following steps:
   moving the cradle along an axis so that the cradle is opposite a separation device so as to successively place an assembly of the cradle in a fracture zone of the separation device; and
   applying, using the separation device, separation forces in the peripheral side groove of the assembly disposed in the fracture zone, the separation forces separating the wafers of the assembly from each other so as to initiate the fracturing thereof on the embrittlement plane.

17. The system of claim 2, wherein the fracture zone is configured to accommodate a single assembly and the separation device processes one assembly at a time.

18. The system of claim 17, wherein the drive device is a cradle support of a furnace, and wherein the cradle is carried by the cradle support.

19. The system of claim 18, wherein the separation device comprises a compressor configured to generate a high-pressure fluid jet.

20. The system of claim 18, wherein the separation device comprises a tool disposed at an end of a movable arm.

* * * * *

UNITED STATES PATENT AND TRADEMARK OFFICE
CERTIFICATE OF CORRECTION

| | |
|---|---|
| PATENT NO. | : 12,002,690 B2 |
| APPLICATION NO. | : 17/435899 |
| DATED | : June 4, 2024 |
| INVENTOR(S) | : Didier Landru, Oleg Kononchuk and Nadia Ben Mohamed |

It is certified that error appears in the above-identified patent and that said Letters Patent is hereby corrected as shown below:

In the Claims

Claim 14, Column 12, Lines 15-16, change "separation device is comprises a presser" to --separation device comprises a presser--

Signed and Sealed this
Tenth Day of December, 2024

Katherine Kelly Vidal
*Director of the United States Patent and Trademark Office*